United States Patent
Breternitz, Jr. et al.

(10) Patent No.: US 6,216,213 B1
(45) Date of Patent: Apr. 10, 2001

(54) METHOD AND APPARATUS FOR COMPRESSION, DECOMPRESSION, AND EXECUTION OF PROGRAM CODE

(75) Inventors: Mauricio Breternitz, Jr.; Roger A. Smith, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/660,368

(22) Filed: Jun. 7, 1996

(51) Int. Cl.[7] ............................. G06F 9/30; H03M 7/30
(52) U.S. Cl. ................................. 711/170; 707/101
(58) Field of Search .................. 395/384, 888; 711/171, 170; 712/208, 213; 710/68; 707/101; 708/203

(56) References Cited

U.S. PATENT DOCUMENTS

| | | | |
|---|---|---|---|
| 5,574,953 | * 11/1996 | Rust et al. ........................... | 711/171 |
| 5,632,024 | * 5/1997 | Yajima et al. ...................... | 395/381 |
| 5,636,352 | * 6/1997 | Bealkowski et al. .............. | 395/384 |
| 5,652,852 | * 7/1997 | Yokota ................................. | 395/384 |
| 5,787,302 | * 7/1998 | Hampapuram et al. ........ | 395/800.24 |
| 5,826,054 | * 10/1998 | Jacobs et al. ...................... | 712/213 |

OTHER PUBLICATIONS

Breternitz Jr., M.;Smith, R. "Enhanced compression techniques to symplify program decompression and execution." Proceedings International Conf on Computer Design VLSI in Computers and Processors (Oct. 12–15, 1997): 170–176.*

A Wolfe and A. Chanin. "Executing compressed programs on an embedded RISC architecture." In Proc. Int'l Symp. on Microarchitecture (1992): 81–91.*

M. Taunton. Compressed executables: An exercise in thinking small. In Proc. of the Summer 1991 USENIX Conference, Nashville, TN, (1991): 385–403.*

Douglis F. "The Compression Cache: Using On–Line Compression to Extend Physical Memory." Proceedings Winter USENIX Conference (Jan. 25–29 1993): 519–529 [Online] Available: http://www.research.att.com/~douglis/papers/.*

Liao S.;Devadas S.;Keutzer K. "Code density optimization for embedded DSP processors using data compression techniques," In Proc. Conf. on Advanced Research in VLSI (1995) [Online] Available: http://rle–vlsi.mit.edu/spam/pubs/liao–arvlsi95.ps.gz.*

Kozuch M.; Wolfe A. "Compression of embedded system programs." In Proc. IEEE Int'l Conf. on Computer Design (1994): 270–277.*

Allen J. "Re: improving external cache bandwidth with compression," [Online] Available news://comp.arch, Mar. 16, 1996.*

Aplin R. "Re: improving external to internal cache bandwidth with compression." [Online] Available news://comp.arch, Mar. 15, 1996.*

* cited by examiner

*Primary Examiner*—Eddie P. Chan
*Assistant Examiner*—Yamir Encarnacion

(57) ABSTRACT

During a compressing portion, memory (20) is divided into cache line blocks (500). Each cache line block is compressed and modified by replacing address destinations of address indirection instructions with compressed address destinations. Each cache line block is modified to have a flow indirection instruction as the last instruction in each cache line. The compressed cache line blocks (500) are stored in a memory (858). During a decompression portion, a cache line (500) is accessed based on an instruction pointer (902) value. The cache line is decompressed and stored in cache. The cache tag is determined based on the instruction pointer (902) value.

14 Claims, 6 Drawing Sheets

METHOD AND APPARATUS FOR COMPRESSION, DECOMPRESSION, AND EXECUTION OF PROGRAM CODE

FIELD OF THE INVENTION

This invention relates generally to data compression, and more particularly, to a data compression for a microprocessor system having a cache.

BACKGROUND OF THE INVENTION

Many modern technologies that use microprocessors or microcontrollers, such as hand-held electronic applications, require high performance processing power combined with highly efficient implementations to reduce system costs and space requirements. The use of instruction caches and data caches in order to improve performance is well known in the industry. In an effort to further reduce system size and cost, it is known to compress instruction data to minimize the amount of memory a system will need. Before an instruction contained in a compressed memory can be used, the information contained within that memory must be decompressed in order for the target data processor to execute.

A prior art method of handling the compression of data for use in a data processor system and the decompression of data for use by that data processor system uses the following steps: dividing the uncompressed program into separate cache blocks; compressing each cache block; and, compacting the individual compressed blocks into a memory. By breaking the program into individual cache blocks, where a cache block represents the number of words in each cache line, it is possible to efficiently compress the data associated with each cache block. Since modern data processing systems generally load an entire cache line at a time, it is possible to fill an entire cache line efficiently by knowing the starting address of a compressed cache block.

The prior art method requires the generation of a look-aside table (LAT). The look-aside table keeps track of which compressed address relates to which cache tag of the data processor. When the instruction pointer of the data processing system requires an address that is not resident within the instruction cache, it is necessary for the data processor system to determine where in compressed memory the required information resides. This information is maintained in the look-aside table stored in the system memory. When a cache miss occurs, the data processor system utilizes a cache refill engine to provide the appropriate information to the next available cache line. The cache refill engine parses the LAT to correlate the new cache tag to the compressed memory. This correlation describes the cache block address, in compressed memory, where the requested instruction resides. Once determined, the compressed memory is accessed, decompressed, and used to fill the appropriate cache line. The cache line containing the newly stored information maintains the original address tag as determined by the instruction pointer for its cache tag. The next time the instruction pointer requests information having the same address tag, a cache hit will occur, indicating the data is in the cache, and processing will continue in a normal fashion, provided the cache line has not been cleared.

In order to reduce the overhead of the cache refill engine having to search through the look-aside table in system memory, it is common for data processor systems to use a compressed cache look-aside buffer CLB. The CLB maintains a list of recently translated address tags and their corresponding address information in compressed memory. By maintaining an on-chip CLB, overhead associated with parsing the LAT is avoided.

A disadvantage of the prior art system is that it requires a translation of the address tag into the appropriate compressed address location. This is accomplished at the expense of providing and maintaining a CLB, and increasing the complexity of the cache refill engine, which must search a LAT in order to determine the appropriate compressed memory location to access. In addition, it is necessary to perform these functions each time a cache miss occurs. As a result, each cache tag will be re-translated every time it is cleared out of the cache. Therefore, a method, and a data processor, that allows for execution of compressed programs while limiting physical overhead and execution time associated with translation is needed.

DETAILED DESCRIPTION OF A PREFERRED EMBODIMENT

Generally, the present invention provides a method and apparatus for compressing instruction memory for use in a cache system, such that the amount of overhead associated with a data processor in terms of size and time of execution is minimized.

Known cached compression systems rely upon the use of look-aside tables (LAT) and compressed cache look-aside buffers (CLB) to decode sequentially addressed cache tags. For example, if an address tag for an instructions is 1234, and the instruction is stored in the final word of a cache line, the next instruction in series would have an address tag 1235.

Assuming the two instructions occur in sequence, a fall through happens, and a cache miss occurs. As a result, the (CLB) will be queried, and ultimately a search through the (LAT) can occur in order to identify the address of the compressed data location containing the needed instruction. Once the address of the compressed location is identified, the data stored there will be loaded into the cache line now containing the cache tag 1235. Note, that there is no relationship between the address tag 1235 and the address location identifying the beginning of the compressed cache block other than the correlation provided by the look-aside table (LAT). The present invention provides a one-to-one correlation between the address tag and the compressed memory. This simplifies the steps of address translation when using compressed instructions.

Figure 1:
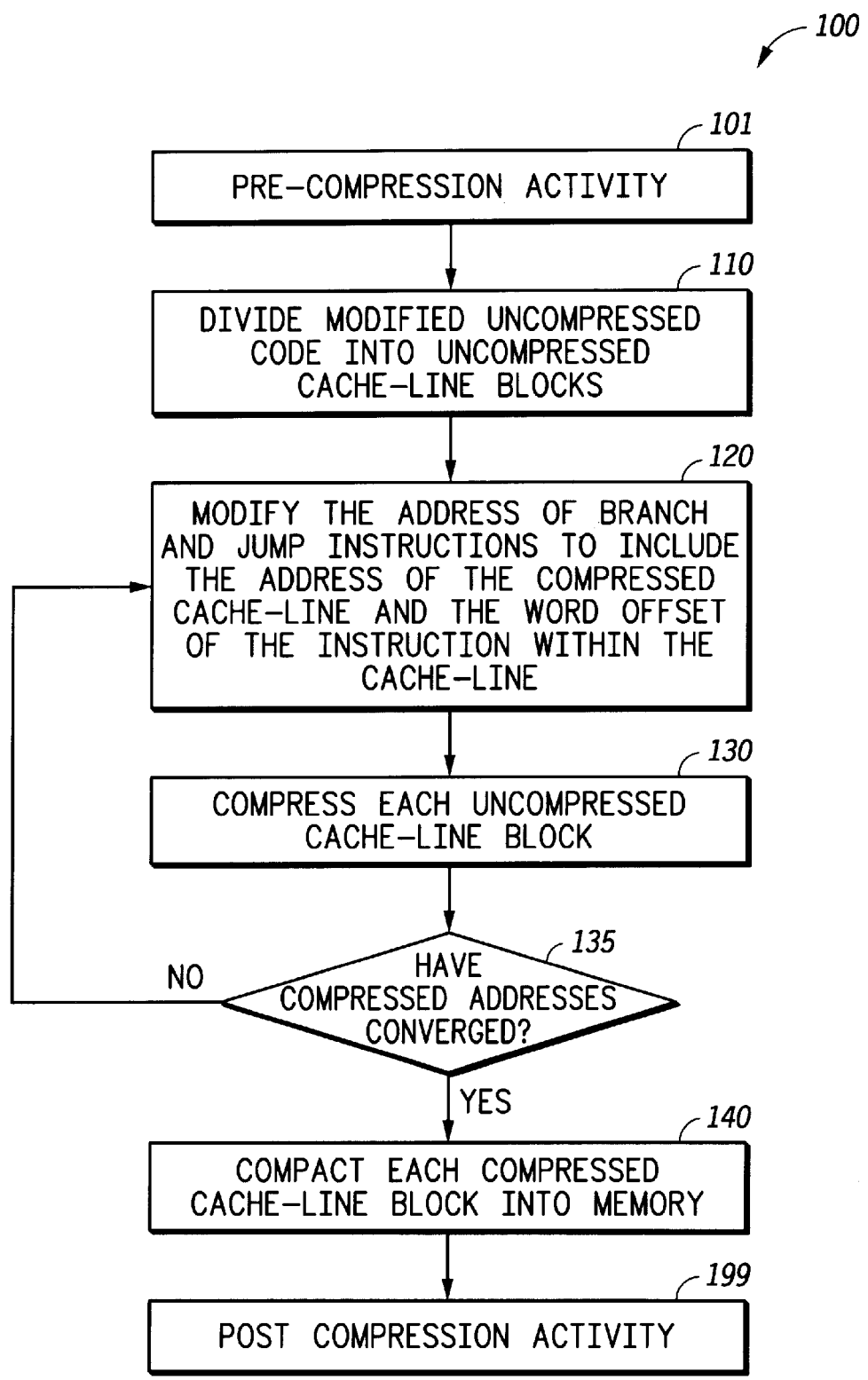
FIG. 1 illustrates, in flow diagram form, a method of compression in accordance with the present invention.

FIG. 1 illustrates, in flow diagram form, a method 100 for compressing computer instructions, such that the computer instructions may be stored in memory and accessed by a data processor without the use of a look-aside table or associated CLB. At step 101, pre-compression steps are completed. This will include such steps as compiling and linking of source code. At step 110, the uncompressed code is divided into uncompressed cache line blocks. For, example, if a cache line holds 16 words, this step could divide the uncompressed modified code into 16 word blocks, or less as needed. After step 110, and before compression, a branch or jump instruction would have a relative displacement or an absolute address which would be used in determining the actual address of the target instruction of the branch or jump instruction. In the prior art, this displacement or absolute address would be compressed. After decompression, it would contain the same displacement or address that it would have had before compression, and the (LAT) or (CLB) would be used to find where the compressed code for the target instruction was located. In step 120 of the present invention, in contrast, the displacement or absolute address in the branch or jump instruction is replaced by a transformed displacement or absolute address before compression. After compression and upon subsequent decompression, this transformed address is to be quickly and unambiguously divisible into the starting address of the compressed cache line in compressed memory and the word offset identifying the instruction location within the cache line. The first time through or on subsequent iterations, the address of the compressed cache line containing the target instruction or the offset of the target instruction within that cache line may not be known. On all except the final pass through step 120, the actual value is not needed. All that is needed is the number of bits which will be required to encode the displacement or absolute value, since in all but the last pass through step 120, the purpose of step 120 is merely to determine how many bits will be needed to carry out the encoding for each cache line. If the number of bits needed to encode the absolute address or displacement is a monotonic non-decreasing function of the magnitude of the absolute address or displacement, it is easy to show that step 120 and each of the other steps in FIG. 1 will only need to be carried out a finite number of times, which guarantees convergence needed for step 135 discussed below. In practice, the number of iterations is likely to be small. If for a particular branch or jump instruction, the target instruction's compressed cache line address has not already been tentatively determined, (for example, a forward branch the first time that step 120 is executed) the number of bits used for the coding should be the minimum number of bits which is permitted for an absolute address or displacement in the particular coding method chosen and the value of these bits is immaterial. Otherwise, the transformed displacement or absolute address should be computed using the address of the compressed cache line and offset of the target instruction and the number of bits needed to encode this transformed value should be used. Next, in step 130, each of the uncompressed cache line blocks is compressed. In addition, it is understood that subsequent iterations of this step may not require complete recompression, as previous compression information may be maintained. Actually, in all but the last stage, only the number of bits and not the actual values of the coded instructions need be determined. At Step 135, a determination is made whether the value of any transformed field will need to be recalculated. This will be necessary if the coded value for any transformed displacement or absolute address was not known the last time that Step 120 was performed or if any displacement could have changed. If so, flow returns to step 120; if not flow continues to step 140. The primary purpose of the loop comprising steps 120 to 135 is to achieve self-consistency between the transformed displacements or absolute addresses and the actual locations of each compressed cache line. One skilled in the art could find numerous minor modifications in the control structure of this loop to achieve the same objective. It is largely immaterial whether the actual compression of the instructions is done once in this loop or after this loop has been completed, since for the purpose of achieving self-consistency only the size of the compressed data is needed, not the actual compressed values. The actual compressed values are only needed once self-consistency has been achieved. At step 140, each compressed line block is compacted into a final memory.

In some implementations, it might be that the transformed displacement would be too large for an instruction format and it might be necessary to alter the original code by replacing a single flow indirection by a pair of flow indirection instructions. In this case, an additional possible control flow back to Step 101 would be required. Provided that these code augmentations only increased code size, the monotonic principle would still apply and convergence would be obtained after a finite number of steps.

Figure 2:
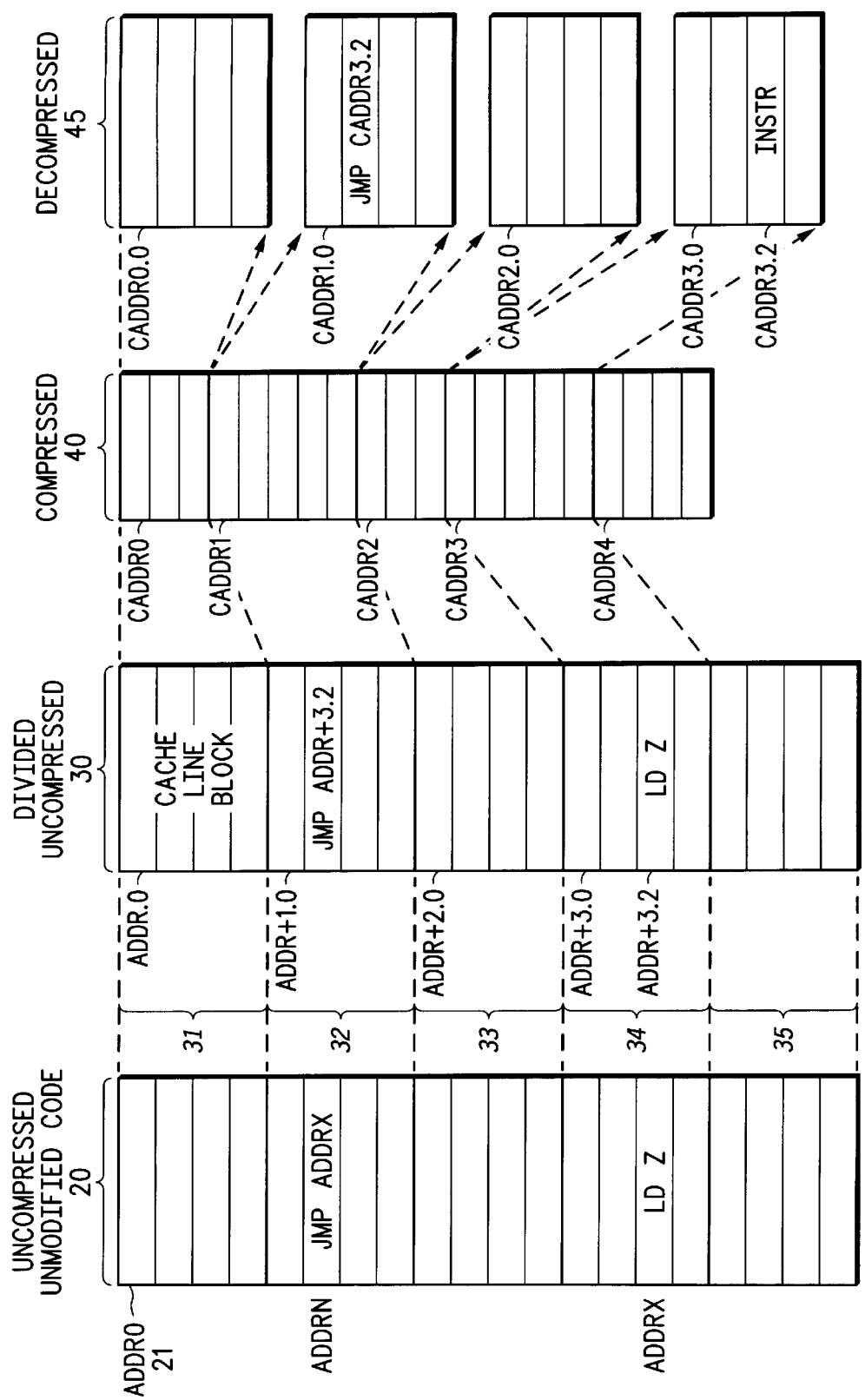
FIG. 2 illustrates, in block diagram form, a memory area at different stage of compression in accordance with the present invention.

FIG. 2 illustrates, in a block diagram, the effects of each step of method 100 on uncompressed unmodified code 20. In one embodiment of the invention, uncompressed unmodified code 20 represents compiled linked code ready to be run in an uncompressed format on a data processor. During step 110, of method 100, the uncompressed unmodified code 20 would be divided into uncompressed cache line blocks as shown in the divided uncompressed code 30. For a given CPU architecture using a fixed instruction size, each cache line block will contain a fixed number of instructions represented. The number of instructions in a given cache line block will be dependent upon the cache line size of the data processing system. In one embodiment of the present invention, there is a one-to-one correspondence between the number of instructions capable of being contained in each cache line block and the number actually stored. In another embodiment there will be fewer instructions stored in each cache line block than can be accommodated by the cache line of the data processor system. For example, if a data processing system was capable of holding 16 instruction words on a single cache line, the cache line block could contain 16 or fewer words. The embodiment of a system containing fewer than the maximum number of words will be discussed later.

Once divided into blocks, the individual instructions can be referenced by a portion of the address known as an address tag, which identifies the beginning of a specific cache line block, and an offset representing an offset into the specific block. At step 120, the address is replaced with an address tag and offset, and a size designator indicating the number of bits reserved for containing the compressed information. During the initial pass through step 120, an estimated number of bits is used, subsequent passes will determine the number of bits based upon the compressed information until all destinations are successfully written. For example, initially the address location ADDRx is referenced as ADDR+3.2 (7). This indicates that location at ADDRx is in the fourth cache block at the third cache location, and that in compressed form, it is expected to be stored in seven bits. Note, the number of needed bits may be stored in a separate memory location. For example, the flow indirection instruction JMP ADDRx is also referenced by JMP ADDR+3.2 as seen in the uncompressed divided code 30. During normal execution, the jump instruction will cause the instruction pointer to be loaded with the value ADDRx that contains the address tag in a portion of the most significant bits, and the offset in the remaining least significant bits. As a result, the instruction pointer will point to the instruction residing at instruction location ADDRx, which in this case contains the instruction LD Z. In future iterations of step 120, a compressed address location will replace the address tag. The addresses of the uncompressed unmodified code 20 can be regarded as physical or logical addresses, where the code starts at an address ADDR0 and is contiguous through the end of file. After the transformation of the addresses has converged, the compressed code 40 provides a compressed representation of the decompressed code 45. The transformed jump instruction, which will be the instruction generated by decompression now will be JMP CADDR3.2, where the CADDR3 component of the address is the address of the first byte of the compressed code for the cache line with the target instruction LD Z and the second component of the address is the offset of the instruction within that cache line after decompression.

At step 130, efficiency is realized by compressing the individual cache line blocks to create compressed code 40, and the compressed destination is stored for each indirection instruction if a sufficient number of bits has been allocated. Next at step 135, flow proceeds to step 120 if all of the addresses have not converged, otherwise flow proceeds to step 140. At step 140, the code is written into memory as represented by compressed data 40. Decompressed code 45 represents the compressed data 40 as used by the data processor system. Note, the address space of the decompressed code 45 is not contiguous.

Figure 3:
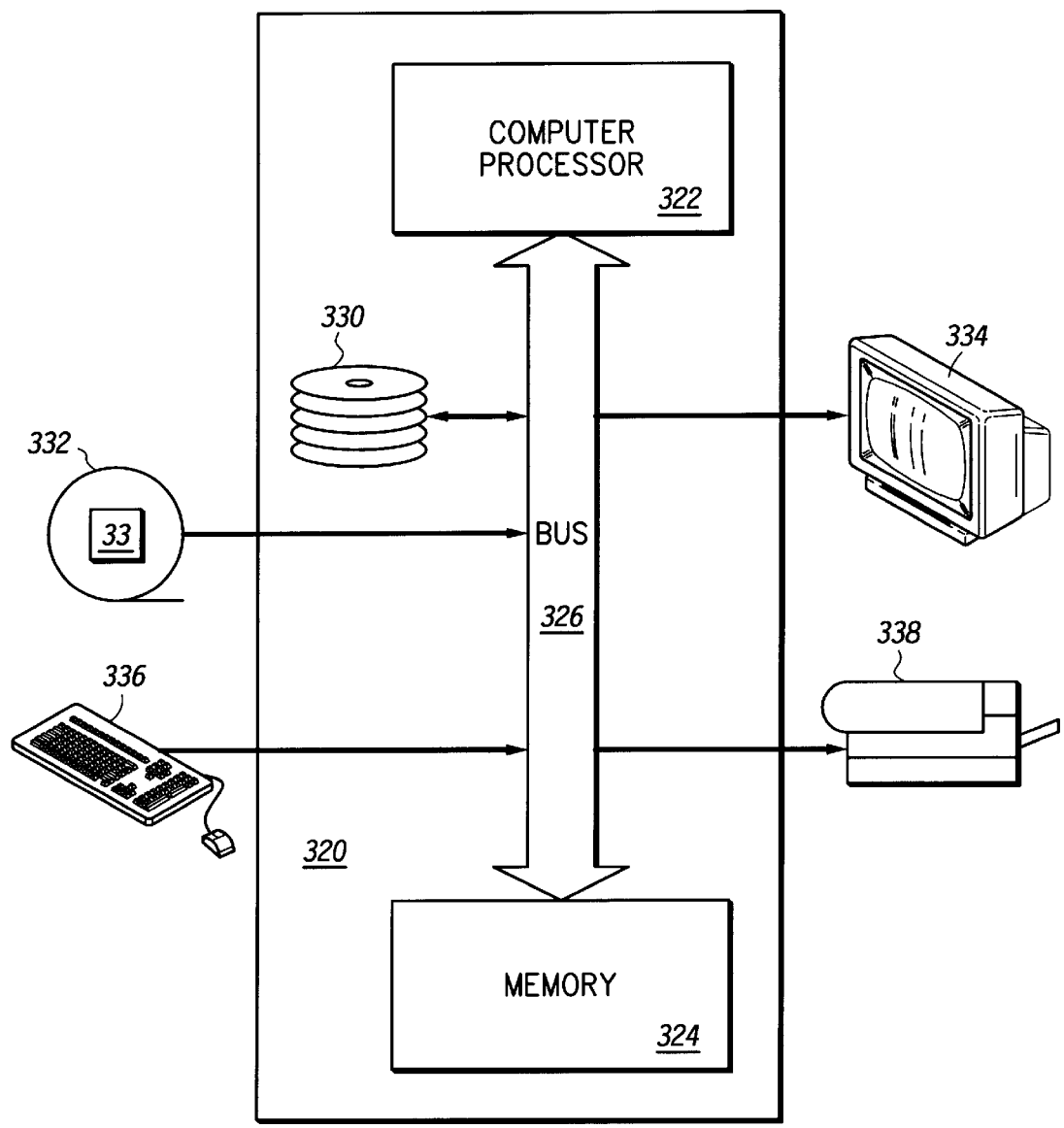
FIG. 3 illustrates, in block diagram form, a data processing system in accordance the present invention.

FIG. 3 represents a data processor system 320 having a computer processor 322. In the system 320, the compressed modified code 40 is contained in memory 324. When a jump instruction is encountered in the instruction flow, the computer processor 322 will determine that the address tag (for example CADDR3 for the JMP CADDR3.2 instruction of FIG. 2) associated with the jump address is not currently in the cache. Therefore, a cache miss signal will be generated and sent to the cache refill engine along with the address tag. The cache refill engine will use the address tag which was provided by the jump instruction and directly access that location (for example CADDR3) within the compressed modified code 40. Directly addressing means that no translation needs to take place between the cache address tag as provided by the computer processor 322, and the actual step of addressing the data referenced by that tag in compressed memory. Therefore, by modifying the uncompressed unmodified code 20 (FIG. 2) to contain the address of the compressed modified code 40, the need for look-aside tables and cacheable translation buffers is eliminated.

The method 100 works well for flow indirection instructions. However, when straight line code is encountered a fall through situation can occur. A fall through situation occurs when a program flow advances from the last instruction of a cache line to the first instruction of the next cache line as a result of the instruction pointer being incremented. This is a normal situation that occurs when sequential code crosses a cache line boundary. In prior art systems, the new cache tag would be generated by incrementing the old tag by one, causing a new address tag to occur. In a prior art data processor system a cached address translation occurs through the use of either the CLB or actually performing a table search in the LAT. The look-up functions identify the appropriate location in compressed memory to retrieve the cache line that contains desired information In the present invention, an incremented cache tag has very little meaning, since the tag is used to access the compressed memory directly. Therefore, an incremented address tag would access the next sequential memory location in the compressed modified code 40. Referring to FIG. 2, if compressed modified code address CADDR2 represented the current address tag, and the address tag were incremented by one, the location CADDR2+1 would reside within the compressed cache line block beginning at address CADDR2, instead of at the desired location CADDR3.

Figure 4:
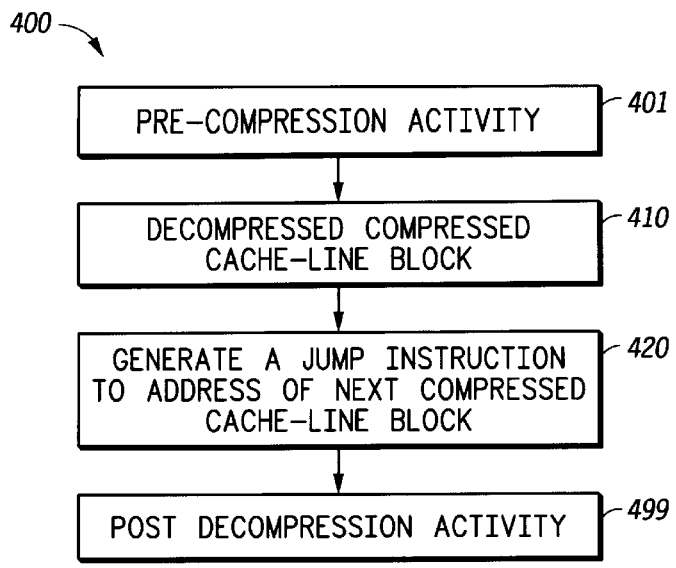
FIG. 4 illustrates, in flow diagram form, a method of decompression in accordance with the present invention.

FIG. 4 illustrates a decompression flow to address the fall through situation. At step 401, any required pre fall-through steps are performed. At step 410, compressed cache line block is decompressed and the size of the compressed block is determined. Next, at a step 420, a jump instruction is generated to redirect flow to the address of the first word of the next compressed cache line block. In order for this flow to function properly, it is necessary for each cache line block to contain at least one less instruction than the maximum cache line size would allow. For example, if the data processor system has a maximum cache line size of 16 words, where each word contains one instruction, during the step 110 of FIG. 1 the modified uncompressed code would be divided into blocks containing 15 words. This would leave space for the decompression routine to store a jump instruction referencing the next instruction. This jump location will redirect flow to the appropriate location within the compressed code, instead of allowing a fall through situation with an incremented address tag. Note, it is likely that many address tags will contain no executable code. This scheme assumes that available address space exists to allow for these unused address tags.

In the embodiment discuss above, it is seen that efficiency is gained at run time by eliminating the need for LATs and CLBs. This is accomplished by applying pre-execution compression after compiling and linking of the source code. This embodiment requires no modifications to the computer processor 322. As a result, the computer processor 322 does not need to support memory management functions of look-aside buffers for the purposes of compressed data, nor does the memory 324 need to contain look-aside tables.

Figure 5:
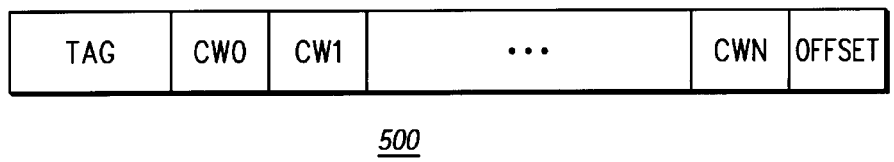
FIG. 5 illustrates, in block diagram form, a cache line.

FIG. 5 illustrates in block diagram form a cache line 500 which may be used in a second embodiment of the invention allowing all cache of the cache block to be used for user instructions. The cache line 500 has a tag and cache words CW0–CWN. In addition, an offset field 510 is associated with the cache line 500. This offset field is used to identify the offset from the beginning of the current cache line in compressed memory to the start of the next compressed cache line in compressed memory. Since the compressed address is accessed directly by the tag of a given cache line, the appropriate tag for the next cache line can be obtained by adding the tag of the current cache line to the offset 510 representing the size of the current cache line in compressed memory. In order to use an offset scheme as described above, it is necessary for the CPU 322 to recognize when the instruction pointer has been incremented across a cache line such that a new tag value can be generated.

Figure 6:
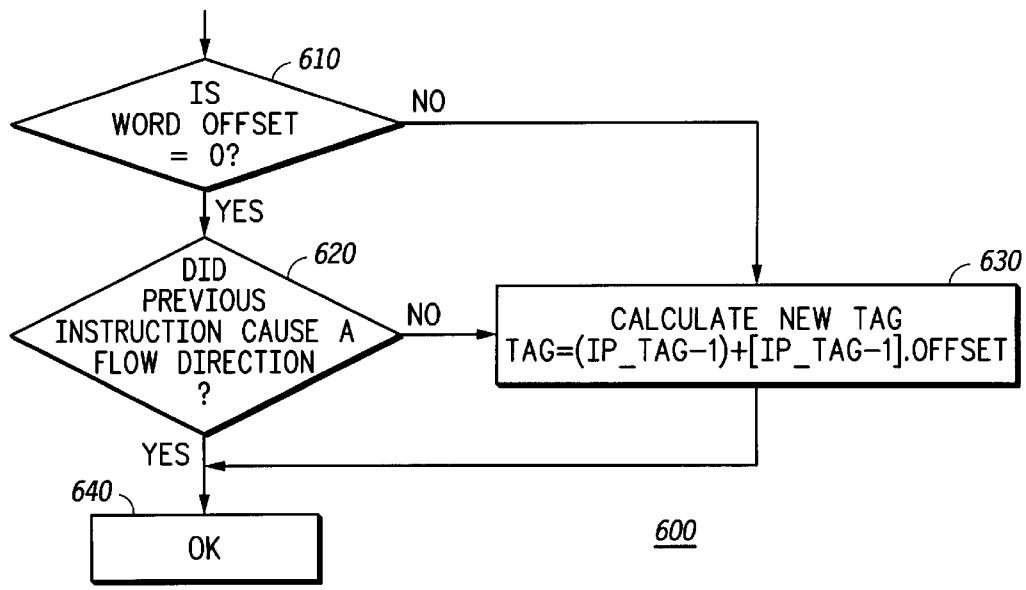
FIG. 6 illustrates, in flow diagram form, a method of determining if a fall through condition exists.

FIG. 6 illustrates a method of determining when a new tag value needs to be generated. The method 600 is used each time an instruction pointer is incremented. At step 610, it is determined if the word offset into the cache line is equal to 0. A word offset of zero can be obtained one of two ways. First, by a jump or branch instruction specifying a destination which is contained in the first word within a cache line. As discussed previously, when a jump or branch instruction is used with current embodiments, the specified tag as a result of a branch or jump will be correct as defined, and no corrective action will be needed. The second way a word offsets of zero is obtained is when a fall through situation occurs between cache lines. For example, for a tag value of $20 ($ designates hexadecimal numbers) and a word offset value of $F, where the cache line holds $F words, the next time the instruction pointer is incremented the offset will go from $F to $0 and the cache tag will be incremented to $21. Again, as discussed previously, the new cache line $21 does not represent a valid location in compressed memory where the next desired cache line begins. Applying this example to FIG. 6 step 610, if the word offset is $0 flow proceeds to step 620. At step 620 it is determined whether the previous instruction was a branch or a jump instruction, whose indirection was taken. If the previous instruction was a branch or jump instruction, and caused an indirection, the cache tag is correct and flow proceeds to step 640 allowing normal operation. However, in that the previous instruction did not cause an indirection a fall through situation has occurred, and flow proceeds to step 630 where a new tag needs to be calculated to identify the next cache line in compressed memory. The new tag is calculated by taking the current address tag, having a word offset of 0, and subtracting 1, this value represents the previous address tag. To this value, the offset of the previous tag, as stored in cache line 500, needs to be added. Normal processor flow may now continue at step 640, as the correct tag has been calculated. It would be obvious to one skilled in the art that this offset field may actually be built into the cache memory structure, or it could be contained in any memory location as long as the information is maintained for each active cache line. The offset of cache line 500 is illustrated in FIG. 5 as an extension of the cache line itself.

At step 610, it is necessary to determine when the word offset is equal to 0. This can be accomplished in a number of ways in either hardware or software. A hardware implementation, which will be discussed with reference to FIGS. 8 and 9, requires generating a signal from the instruction sequencer when the offset value were 0. This information, along with other cache information, would be used by the decompression program to calculate the new tag and access the appropriate information in compressed memory.

Figure 7:
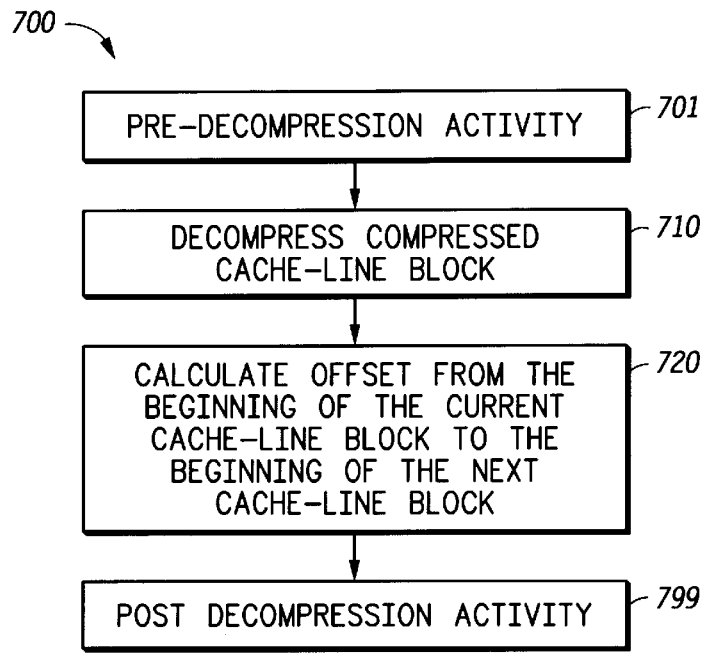
FIG. 7 illustrates, in flow diagram form, another method of decompression in accordance with the present invention.

FIG. 7 illustrates in block diagram form a flow 700 which can fill the cache line 500. Steps 701 and 710 are identical to steps 401 and 410 of FIG. 4 and will not be discussed further. Step 720 of the decompression method 700 calculates the compressed cache line size from the beginning to the end of the cache line block being decompressed. Next, at step 799, post decompression occurs. This would include forwarding the information decompressed as well as the offset information to the cache line 500 or appropriate memory locations.

Figure 8:
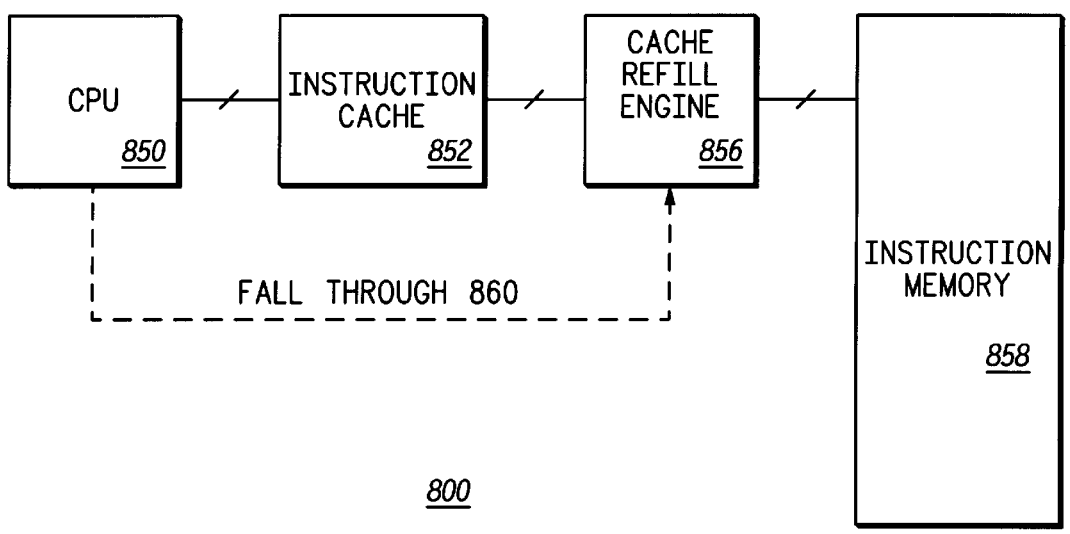
FIG. 8 illustrates, in block diagram form, a detailed view a computer processor from FIG. 2.

FIG. 8 illustrates, in block diagram form, an implementation of the computer processor 22 (FIG. 3), and an instruction memory 858 for implementing a hardware version of step 610 (FIG. 6). In one embodiment of the invention, the computer processor 22 comprises a CPU 850, an instruction cache 852, and a cache refill engine 856. In a different embodiment, the instruction memory 858 could be part of the computer processor. Likewise, the cache refill engine 856, or the instruction cache 852, could reside outside of the computer processor 22. The CPU 850 is coupled to the instruction cache 852 and generates a fall through signal 860 which is coupled to the cache refill engine 856. The instruction cache 852 is coupled to the cache refill engine 856. The cache refill engine 856 is coupled to the instruction memory 858.

Figure 9:
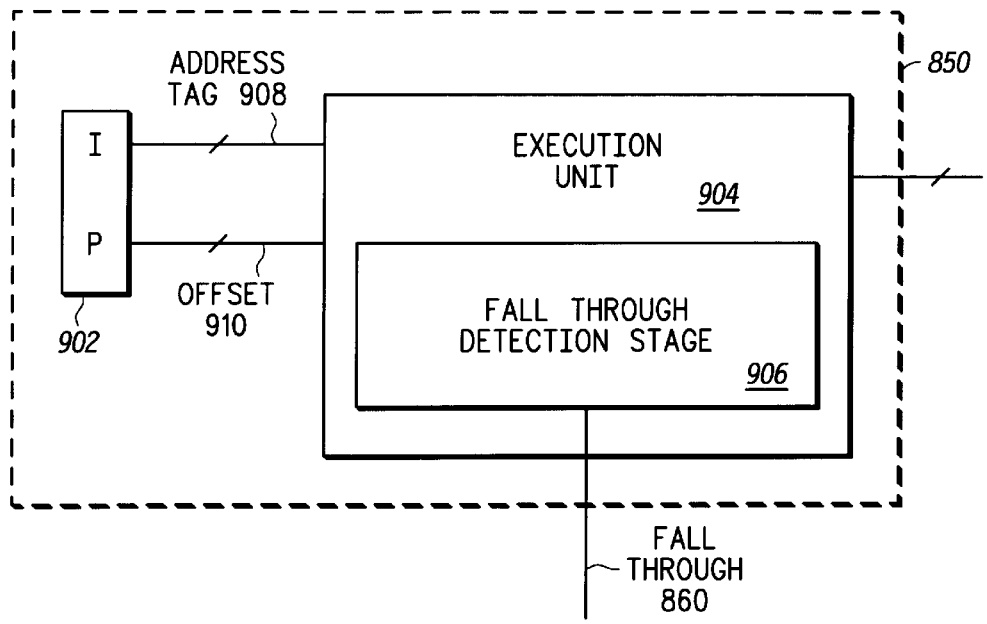
FIG. 9 illustrates, in block diagram form, a detailed view of the computer processor 22 of FIG. 8.

The CPU 850 generates a fall through signal 860 which is received by the cache refill engine 856. The fall through signal 860 notifies the cache refill engine 856 that a fall through situation has occurred as discussed above. FIG. 9 illustrates, in more detail, the generation of the fall through signal 860. In FIG. 9, the CPU 850 is shown having an instruction pointer 902 which is coupled to the execution unit 904. The execution unit 904 having a fall through detection stage 906. The instruction pointer 902 generates the current instruction address, this address has an address tag component 908 and an offset component 910. The address tag component 908 is compared to instruction cache tags to determine if a needed instruction currently resides in the instruction cache 852. Once a successful comparison has occurred, the offset 910 is used to determine which instruction contained in the matching cache line has the current instruction. An offset of 0 indicates that the first instruction in a given instruction cache is being addressed. The fall through detection stage generates the fall through signal 860 by monitoring the offset 910, and generating an active fall through signal when the offset 910 is equal to zero.

The cache refill engine 856 upon receiving the asserted fall through signal 860 determines whether the previously executed instruction was a flow indirection instruction that took the indirection branch. If so, the current address tag is correct, as previously discussed. If the previous instruction did not cause an indirection to occur, then a fall through situation has occurred and a new tag needs to be generated. The generation of the new address tag is performed by the cache refill engine, using the methods discussed previously, such as calculating the new address tag based on the compressed size of the previous cache line and its address tag.

Figure 10:
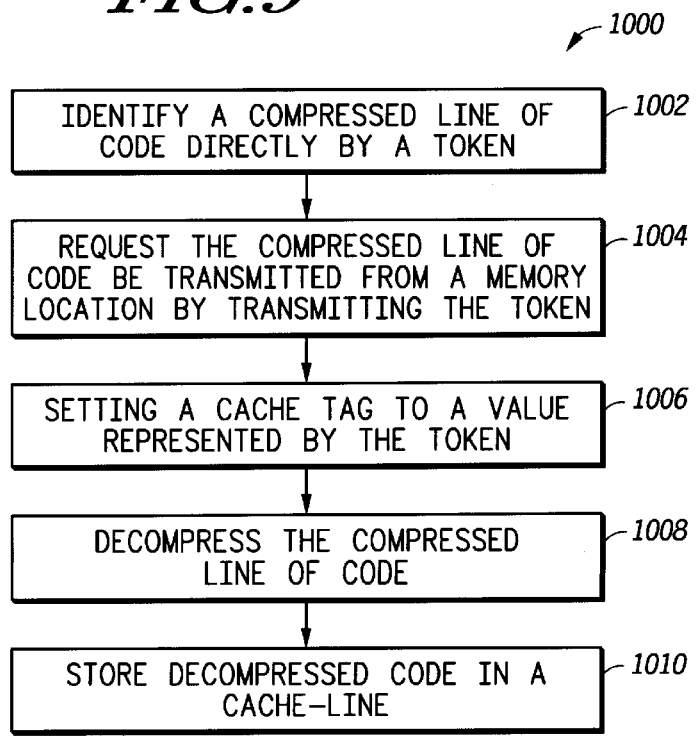
FIG. 10 illustrates, in flow diagram form, another method of compression in accordance with the present invention.

FIG. 10 illustrates a flow 1000 in accordance with the present invention. Flow 1000 begins at a step 1002. At step 1002, a compressed line of code is identified directly by a token. This token has a cache line offset which indicates where a compressed cache line begins, and a word offset which defines which instruction in the cache line is to be accessed. Next, at a step 1004, the compressed cache line is requested to be transmitted from a memory location by transmitting the token. Next, at step 1006, a cache tag is set to equal the cache line offset value represented by the token. Next, at step 1008, the compressed line of code is decompressed. Next, at step 1010, the decompressed code is stored in a cache line.

It is understood that there are many alternative embodiments of the present invention that may be performed. For example, one such embodiment would be to calculate the offset between the current compressed cache line and the next compressed cache line during the compression routine 100, and storing the information somewhere within the compressed block of data. This would eliminate the need to calculate the offset during the decompression step 720 of FIG. 7. In addition, many of these functions may be performed in either hardware or software and this specification does not address all of the possible embodiments Another embodiment would be similar to the first embodiment, however, instead of storing a jump instruction at the last word location of the cache line, the compression routine could store a second cache line of data at an available cache having a tag equal to the current cache tag incremented by one, the jump would be the only instruction contained in this cache line would be stored at the 0 offset location, and would jump to the beginning of the next appropriate cache line. A disadvantage of this embodiment is that an entire cache line would be used to contain a single instruction.

What is claimed is:

1. A method of compressing instruction data comprising the steps of:
   partitioning the instruction data into a plurality of data blocks;
   modifying a flow indirection instruction in the instruction data to have a modified destination which references a compressed address location, thereby creating a modified instruction data, wherein the flow indirection instruction is one of a plurality of instructions associated with one of the plurality of data blocks; and
   after the step of modifying, compressing each of the plurality of data blocks, wherein each of the plurality of data blocks is referred to as a compressed block, and each compressed block contains a plurality of instruction data.

2. The method of claim 1 further comprising the step of:
   storing each compressed block in a memory area to create a compressed memory.

3. The method of claim 1 where in the step of partitioning the modified instruction data includes the step of partitioning the instruction data.

4. The method of claim 1 wherein the compressed address location comprises a first address reference representing a beginning address of the compressed block containing an instruction data destination of the flow indirection instruction, and a second address representing an offset, wherein the offset indicates which one of the plurality of instruction data in the compressed block represents the instruction data destination.

5. The method of claim 2 further including the step of:
   adjusting each modified destination, after the step of compressing, that does not correlate to a beginning address of the compressed block containing an instruction data destination, such that each modified destination does correlate to the beginning address of the compressed block containing the instruction data destination.

6. The method of claim 1, wherein the step of compressing includes at least partially compressing each of the plurality of data blocks.

7. The method of claim 6, wherein partially compressing includes compressing the modified instruction data.

8. A computer readable medium (storage medium) for storing a data compression routine comprising the steps of:
   partitioning the instruction data into a plurality of data blocks;
   modifying a flow indirection instruction in the instruction data to have a modified destination which references a compressed address location, thereby creating a modified instruction data, wherein the flow indirection instruction is one of a plurality of instructions associated with one of the plurality of data blocks; and
   after the step of modifying, compressing each of the plurality of data blocks, wherein each of the plurality of data blocks is referred to as a compressed block, and each compressed block contains a plurality of instruction data.

9. A method of compressing instruction data comprising the steps of:
   identifying a first block of instruction data having a plurality of instructions including a flow indirection instruction having a destination indicator associated with a destination;
   identifying a second block of instruction data including the destination;
   modifying the flow indirection instruction to have a modified destination which references a compressed destination location; and
   after the step of modifying, compressing at least a portion of the first and second data block.

10. The method of claim 9, wherein:
    the step of compressing the first and second data block results in a second compressed block having a second compressed address value, the second compressed address value identifying the start of the second compressed block, wherein the compressed destination location is different than the second compressed address value.

11. The method of claim 9, wherein the first block of instruction data and the second block of instruction data have the same number of elements.

12. The method of claim 11, where elements include instructions.

13. The method of claim 11, where elements include bytes.

14. The method of claim 9, wherein the modified destination includes a tag portion and an offset portion.

* * * * *